United States Patent [19]
Osanai

[11] Patent Number: 5,376,988
[45] Date of Patent: Dec. 27, 1994

[54] PARALLEL-MOVING APPARATUS AND LENS MOVING DEVICE IN AN EXPOSING APPARATUS USING THE SAME

[75] Inventor: Eiji Osanai, Yokohama, Japan

[73] Assignee: Canon Kabushiki Kaisha, Tokyo, Japan

[21] Appl. No.: 188,016

[22] Filed: Jan. 28, 1994

[30] Foreign Application Priority Data

Feb. 2, 1993 [JP] Japan .................................. 5-037421

[51] Int. Cl.⁵ ............................................. G03B 27/42
[52] U.S. Cl. .................................. 355/53; 355/55; 355/75; 355/76
[58] Field of Search ...................... 355/53, 55, 75, 76

[56] References Cited

U.S. PATENT DOCUMENTS

| | | | |
|---|---|---|---|
| 4,588,288 | 5/1986 | Nakasugi et al. ............ | 355/53 |
| 5,228,358 | 7/1993 | Sakino et al. ............ | 74/479 R |

FOREIGN PATENT DOCUMENTS

| | | |
|---|---|---|
| 57-35799 | 7/1982 | Japan . |
| 60-171157 | 9/1985 | Japan . |

Primary Examiner—Michael L. Gellner
Assistant Examiner—D. P. Malley
Attorney, Agent, or Firm—Fitzpatrick, Cella, Harper & Scinto

[57] ABSTRACT

A parallel-moving apparatus includes a fixed table with a static pressure bearing pad, and a movable table with an inclined static pressure bearing pad. A driving plate having a wedge-shaped cross-section is disposed between the fixed table and the movable table, and both surfaces thereof are parallel to the static pressure bearing pad of the movable table and the static pressure bearing pad of the fixed table, and are noncontact-supported thereby. When the driving plate is moved by an actuator, the movable table is moved toward or away from the fixed table while keeping its parallelism to the fixed table.

7 Claims, 5 Drawing Sheets

PARALLEL-MOVING APPARATUS AND LENS MOVING DEVICE IN AN EXPOSING APPARATUS USING THE SAME

BACKGROUND OF THE INVENTION

1. Field of the Invention

This invention relates to a parallel-moving apparatus for use in a positioning apparatus used in various measuring apparatuses, precision machine tools and semiconductor exposing apparatuses etc., and a lens moving device in an exposing apparatus using the same.

2. Related Background Art

In various measuring apparatuses, precision machine tools and semiconductor exposing apparatuses etc., it is necessary to effect the positioning of an object to be measured, a workpiece or a lens highly accurately. Particularly for movement of a holding table supporting the object to be measured thereon in a vertical direction or the positioning of the lens in the direction of the optical axis thereof, it is required to control minute displacement highly accurately. For this purpose, there has been developed a parallel-moving apparatus capable of converting large displacement into minute displacement.

Figure 5:
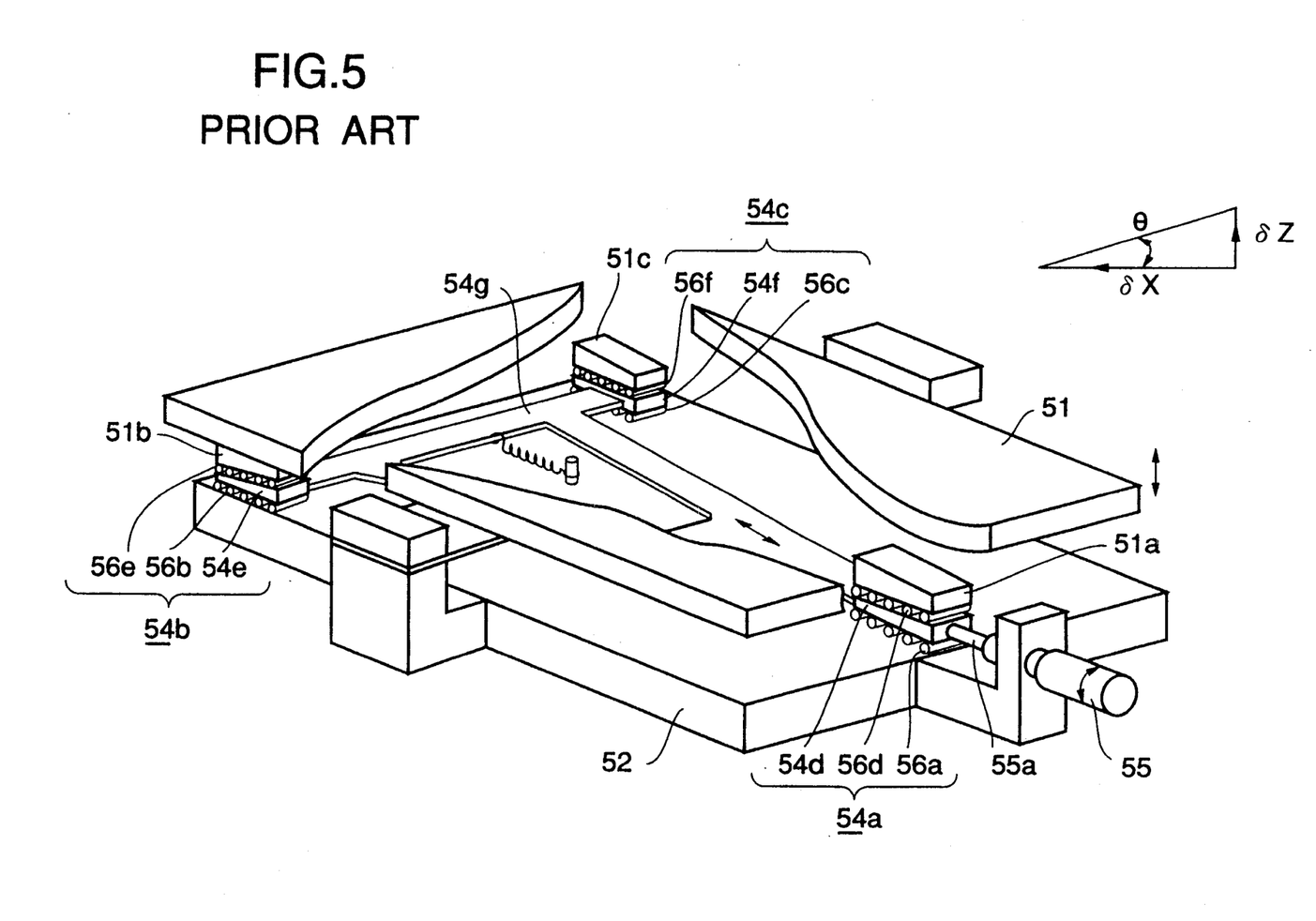
FIG. 5 is a perspective view showing an example of a conventional art.

FIG. 5 of the accompanying drawings shows an example of the parallel-moving apparatus according to the conventional art (Japanese Patent Publication No. 57-35799), wherein a movable table 51 is moved up and down by three sets of displacement reducing mechanisms 54a, 54b, 54c provided on a fixed table 52. The displacement reducing mechanisms 54a, 54b, 54c, each comprise wedge-shaped driving members 54d, 54e, 54f provided between the fixed table 52 and the movable table 51, first needle-like roller trains 56a, 56b, 56c provided between the wedge-shaped driving members and the fixed table 52, and second needle-like roller trains 56d, 56e, 56f provided between support plates 51a, 51b, 51c secured to the movable table 51 and the wedge-shaped driving members 54d, 54e, 54f. The wedge-shaped driving members 54d, 54e, 54f of the three sets of displacement reducing mechanisms 54a, 54b, 54c are integrally coupled together by a connecting plate 54g, and are moved along the surface of the fixed table 52 by the push rod 55a of a micrometer head 55 urged against one end surface of the fixed table 52. That is, when the micrometer head 55 is driven, the three wedge-shaped driving members 54d, 54e, 54f, are each horizontally moved by an equal distance at a time, whereby the movable table 51 is moved up and down while maintaining its parallelism to the fixed table 52. The relation that $\delta Z = \delta X \cdot \tan(\theta)$ is established among the angle of inclination $\theta$ of each wedge-shaped driving member 54d, 54e, 54f, the amount of horizontal movement $\delta X$ thereof and the amount of vertical movement $\delta Z$ of the movable table 51. Therefore, the smaller the angle of inclination is of the wedge-shaped driving members 54d, 54e, 54f, the easier it becomes to control the amount of vertical movement of the movable table 51 highly accurately.

Also, there has been developed an exposing apparatus in which a parallel-moving apparatus is incorporated into a lens-barrel to correct the magnification of a projection lens (see Japanese Patent Publication No. 60-171157).

SUMMARY OF THE INVENTION

The conventional art, however, has the following problems to be solved.

(1) Since the movable table is moved by the three wedge-shaped driving members of a small area, backlash or rolling occurs during the movement thereof and positioning accuracy is reduced.

(2) To control the amount of movement of the movable table highly accurately, it is required that the circularity and cylindricality of the needle-like roller trains, etc. and the planarity and smoothness of the contact surfaces thereof be high and therefore, the working cost thereof is very high.

(3) In the case of the rolling guide of the needle-like roller trains, etc., when they are of high load capacity and high rigidity but require the positioning accuracy of 0.1 $\mu$m or less, the obtainment of high accuracy is difficult under the influence of rolling friction.

(4) Periodical oil supply to the rolling surfaces of the needle-like roller trains, etc. is required, but it cannot be applied to a semiconductor projection exposing apparatus because the lens-barrel of the projection lens of such an apparatus is required to be maintenance-free and have a high degree of cleanness therein.

Also, the lens moving apparatus in the conventional exposing apparatus has suffered from the disadvantage that when a driving stroke of about 1 mm or less is required, it is impossible in principle or rigidity becomes very weak or the like.

The present invention has been made in view of the above-noted problems peculiar to the conventional art and has as its object the provision of a parallel-moving apparatus in which the amount of movement of a movable table can be controlled highly accurately and moreover the working cost is low and maintenance is simple and the degree of cleanness is high, and a lens moving device in an exposing apparatus using the same.

To achieve the above object, the parallel-moving apparatus of the present invention includes a fixed table, a first static pressure bearing, a driving plate having a first surface and a second surface inclined with respect thereto with the driving plate being noncontact-supported on the fixed table on the first surface side through the first static pressure bearing. Also provided is a driver for moving the driving plate along the fixed table, a second static pressure bearing, a movable table noncontact-supported on the driving plate on the second surface side through the second static pressure bearing, support means for supporting the movable table for movement toward and away from the fixed table, and biasing means for biasing the movable table toward the fixed table with the driving plate. A surface of the fixed table which is opposed to the driving plate is substantially parallel to the first surface of the driving plate, and a surface of the movable table which is opposed to the driving plate is substantially parallel to the second surface of the driving plate.

The support means may preferably have third static pressure bearing means for noncontact-supporting the outer peripheral edge of the movable table.

Also, a lens moving device in an exposing apparatus using the parallel-moving apparatus of the present invention is characterized in that the fixed table is an annular lens fixing member, the driving plate is an annular lens driving member, and the movable table is a lens moving member holding the outer peripheral edge of a lens.

According to the above-described parallel-moving apparatus, the driving plate is driven by the driving means, whereby the movable table can be moved toward or away from the fixed table while keeping its parallelism to the fixed table. The ratio between the amount of movement of the driving plate and the amount of movement of the movable table becomes smaller as the angle of inclination of each surface of the driving plate becomes smaller. Since those surfaces of the movable table and the fixed table which are opposed to the driving plate are parallel to both surfaces of the driving plate, the support area by the static pressure bearing means can be made large. Accordingly, the amount of movement of the movable table can be controlled highly accurately without any backlash or any inclination when the movable table is moved. Also, since the driving plate is noncontact-supported by the static pressure bearing means, there is no possibility of accuracy being reduced by friction and moreover, a high degree of planarity and a high degree of smoothness are not required of the surfaces opposed to these and accordingly, the working cost is low. In addition, oil supply is not required.

Also, the lens moving device in the exposing apparatus using the above-described parallel-moving apparatus supports the lens stably, and when the lens is moved, there is no possibility of making localized stress generate.

DETAILED DESCRIPTION OF THE PREFERRED EMBODIMENTS

Figure 1:
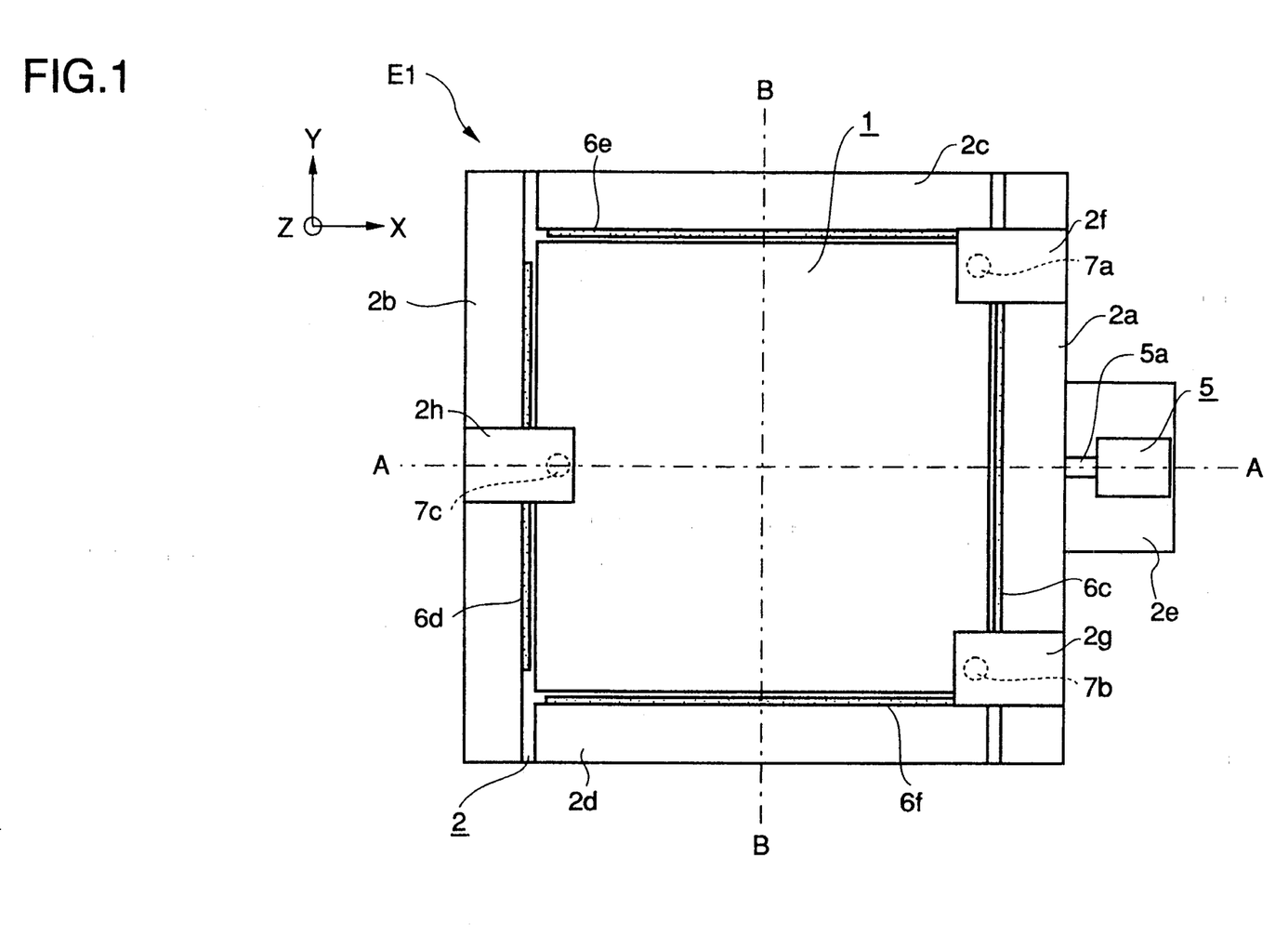
FIG. 1 is a schematic plan view showing a first embodiment of the present invention.

Referring to FIG. 1 which is a schematic plan view showing a first embodiment of the present invention, a parallel-moving apparatus $E_1$ according to the present embodiment has a movable table 1 for supporting a workpiece, a substrate or the like thereon, and a fixed table 2 supporting the movable table. The fixed table 2 has a pair of first fixed guides 2a, 2b provided upright in proximity to the pair of mutually opposed side edges of the fixed table, a pair of second fixed guides 2c, 2d provided upright in proximity to the other pair of mutually opposed side edges of the fixed table, an actuator supporting plate 2e provided adjacent to and integrally with one of the first fixed guides, 2a, a pair of preloaded spring support plates 2f, 2g provided integrally on the upper end of one of the first fixed guides, 2a, and a preloaded spring support plate 2h provided integrally on the upper end of the other first fixed guide 2b.

Figure 2A:
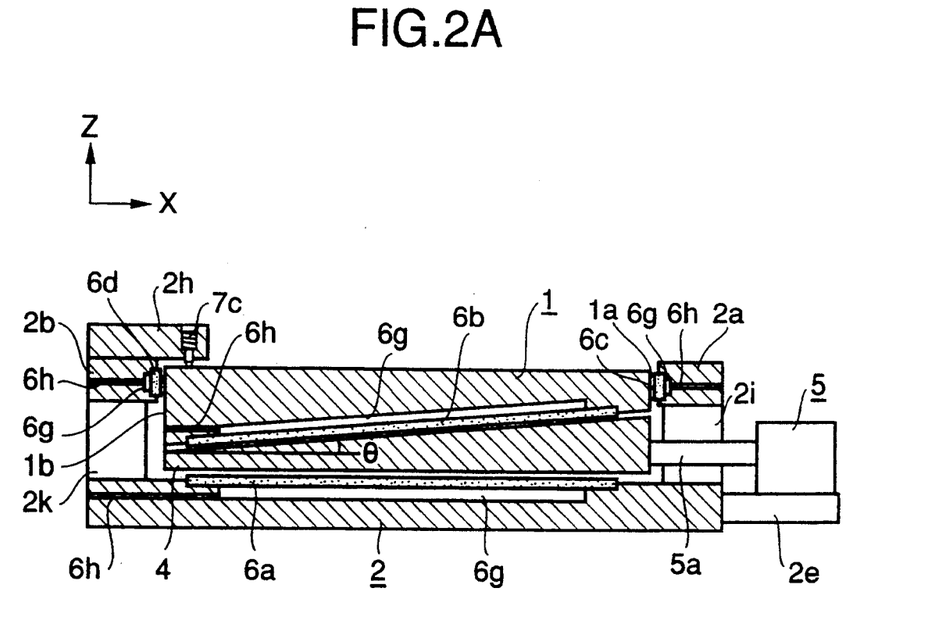
FIGS. 2A and 2B show the cross-sections of the apparatus of FIG. 1, FIG. 2A being a cross-sectional view taken along the line A—A of FIG. 1, and FIG. 2B being a cross-sectional view taken along the line B—B of FIG. 1.
Figure 2B:
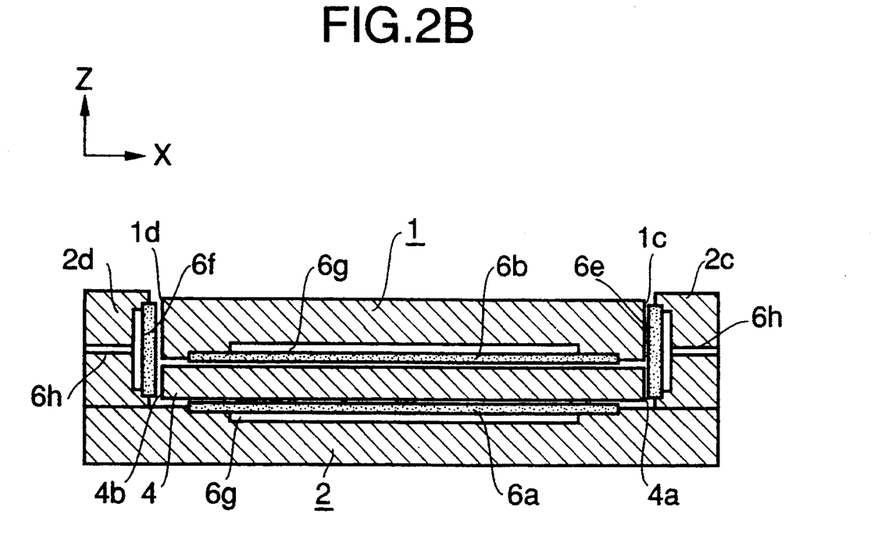

As shown in FIGS. 2A and 2B, a driving plate 4, having a wedge-shaped cross-section in a direction along the line A—A of FIG. 1 (hereinafter referred to as the "X direction") and not varying in thickness in a direction indicated by the line B—B of FIG. 1 (hereinafter referred to as the "Y direction"), is disposed between the movable table 1 and the fixed table 2, and the connecting rod 5a of an actuator 5 which is driving means such as a linear motor supported by the actuator supporting plate 2e is integrally secured to one end surface of the driving plate 4 in X direction. The actuator 5 reciprocally moves the driving plate 4 in the X direction through the connecting rod 5a. Static pressure bearing pads 6a and 6b which are first and second static pressure bearing means are provided on the upper surface of the fixed table 2 and the lower surface of the movable table 1, respectively, as viewed in FIG. 2, and the static pressure bearing pads 6a and 6b noncontact-support the driving plate 4 for reciprocal movement therebetween. Preloading springs 7a, 7b, 7c which are biasing means supported by the preloading spring support plates 2f, 2g, 2h, respectively, bear against the upper surface of the movable table 1 as viewed in FIG. 2, and bias the movable table 1 toward the upper surface of the fixed table 2 with the driving plate 4.

The upper surface of the driving plate 4 is inclined in the X direction, and the lower surface of the movable table 1 is also inclined in parallelism thereto. Accordingly, when the driving plate 4 is moved in the X direction by the actuator 5, the movable table 1 is moved in a direction perpendicular to the X direction and the Y direction (hereinafter referred to as the "Z direction") while keeping its parallelism to the fixed table 2. The relation that $\delta Z = \delta X \cdot \tan(\theta)$ is established among the amount of movement $\delta X$ of the driving plate 4 in the X direction, the angle of inclination $\theta$ of the inclined surface of each of the driving plate 4 and the movable table 1, and the amount of movement $\delta Z$ of the movable table 1 in Z direction. If as an example, $\delta X = 10$ mm and $\theta = 2.8624$ degree, the amount of movement $\delta Z$ of the movable table 1 is 0.5 mm, which is a reduction to 0.05 time the amount of movement of the driving plate 4.

Also, the opposite side edges 1a and 1b of the movable table 1 in the X direction are noncontact-supported by static pressure bearing pads 6c and 6d, respectively, formed of a porous material which are held on the first fixed guides 2a and 2b, respectively, and the opposite end edges 1c and 1d of the movable table 1 in the Y direction are also noncontact-supported by the upper halves of the static pressure bearing pads 6e and 6f, respectively, of the second fixed guides 2c and 2d constituting third static pressure bearing means with the static pressure bearing pads 6c and 6d. Further the opposite end edges 4a and 4b of the driving plate 4 in the Y direction are noncontact-supported by the lower halves of the static pressure bearing pads 6e and 6f, respectively, of the second fixed guides 2c and 2d. The first fixed guides 2a and 2b have openings 2i and 2k, respectively, below the static pressure bearing pads 6c and 6d held thereon, and are designed to be capable of protruding outwardly of the first fixed guides 2a and 2b through the openings 2i and 2k when the driving plate 4 is moved in the X direction by the actuator 5.

The static pressure bearing pads 6a–6f are known porous static pressure bearing pads, and each of them has a void 6g on the back thereof, and disperses, by its pores, pressurized air supplied from a pressurized air supply source, not shown, via an internal pipe 6h and ejects the pressurized air to the surface opposed thereto, and noncontact-supports the opposed surface by the action of fluid lubricating film formed by the static pressure of the pressurized air. Self-restrictor type static pressure bearings may be employed in place of the porous static pressure bearing pads.

In the present embodiment, the driving plate is non-contact-supported by the static pressure bearing pads and therefore, the surfaces thereof opposed to The fixed table and the movable table need not be finished highly accurately and moreover, both surfaces of the driving plate are uniformly supported by air film and the averaging of the worked shape accuracy is done. Therefore is very little possibility of pitching and rolling during the movement of the driving plate, and thus, the positioning accuracy of the movable table can be greatly improved.

Also, the outer peripheral edge of the movable table is noncontact-supported by the static pressure bearing pads and therefore, as compared with a case where the movable table is connected to the fixed guides by leaf springs or the like, there is no fluctuation of the supporting force and the allowable value of the amount of movement of the movable table in Z direction can be made as large as e.g. about 0.5 mm. Moreover, there is an advantage that the vibration of the outside can be fastly absorbed.

Further, oil supply is not required unlike a case where roller bearings are used, and accordingly, maintenance is simple and there is no possibility of the apparatus and atmosphere being contaminated by oil supply.

Figure 3:
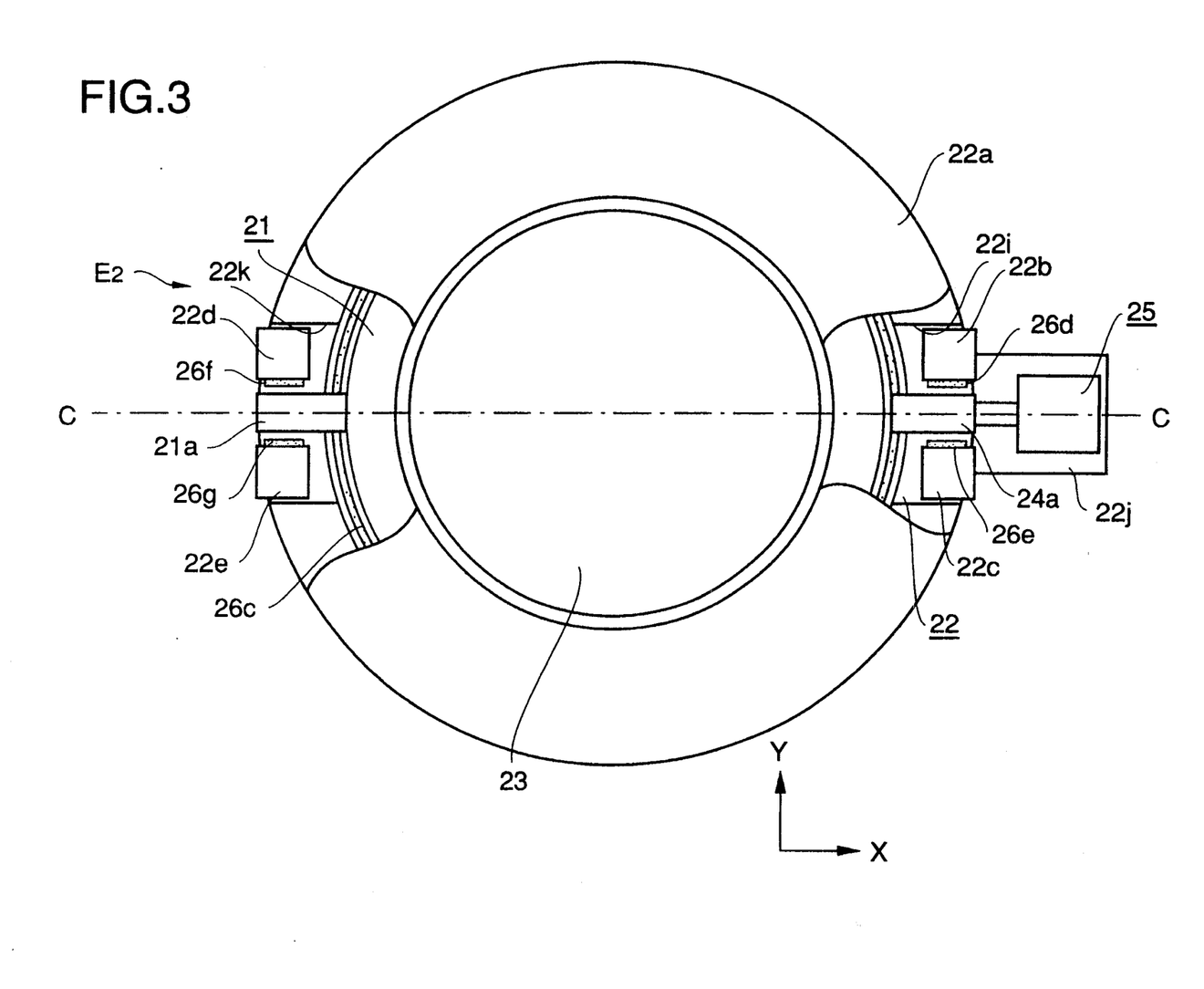
FIG. 3 is a partly broken-away plan view showing a second embodiment of the present invention.

FIG. 3 is a partly broken-away plan view showing a second embodiment of the present invention, and particularly shows an embodiment in which the present invention is applied to an exposing apparatus which is utilized in the manufacturing process of semiconductive devices and in which circuit patterns which are original on masks or reticles are projected onto and exposed on semiconductive wafers through a projection lens. A lens moving device $E_2$ in the exposing apparatus of the present embodiment has a ring-like lens moving member 21 for holding a lens 23 forming a part of the aforementioned projection lens, and an annular lens fixing member 22 for supporting the lens moving member, and the lens fixing member 22 has a tubular fixed guide 22a provided upright on the outer peripheral portion thereof, and an actuator supporting plate 22j integrally provided on the outer peripheral edge of the lens fixing member 22.

Figure 4:
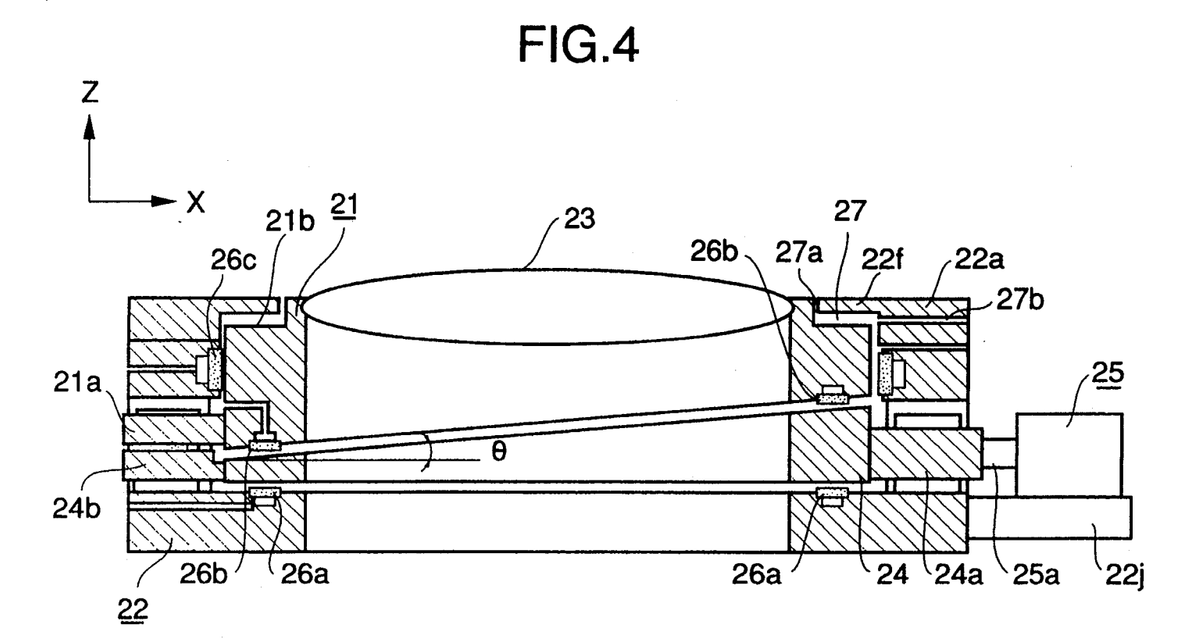
FIG. 4 is a cross-sectional view taken along the line C—C of FIG. 3.

As shown in FIG. 4, a ring-like lens driving member 24 having a wedge-shaped cross-section in a direction indicated by the line C—C in FIG. 3 (hereinafter referred to as the "X direction") and not varying in thickness in a direction perpendicular thereto (hereinafter referred to as the "Y direction") is disposed between the lens moving member 21 and the lens fixing member 22, and a connecting member 24a protruding diametrically outwardly is integrally provided on one end of the lens driving member 24 in the X direction. The connecting member 24a is integrally secured to the connecting rod 25a of an actuator 25 which is driving means such as a linear motor etc. supported by the actuator supporting plate 22j. Also, a guide member 24b protruding diametrically outwardly is integrally provided on the other end of the lens driving member 24 in the X direction, and likewise, the lens driving member 21 has an anti-rotation guide 21a at a location where the lens driving member 21 overlaps the guide member 24b of the lens driving member 24.

The tubular fixed guide 22a has diametrically extending openings 22i and 22k at the opposite ends thereof in X direction, and a pair of guide blocks 22b, 22c and a pair of guide blocks 22d, 22e having their lower ends secured to the lens fixing member 22 are disposed in the openings 22i and 22k, respectively, and the guide blocks 22b, 22c provided in one opening 22i are disposed in opposed relationship with the both sides of the connecting member 24a of the lens driving member 24, and the guide blocks 22d, 22e provided in the other opening 22k are disposed in opposed relationship with the respective both sides of the guide member 24b of the lens driving member 24 and the anti-rotation guide 21a of the lens moving member 21.

Also, an annular overhanging piece 22f protruding diametrically inwardly from the inner peripheral edge of the tubular fixed guide 22a is integrally provided on the upper end of the tubular fixed guide 22a as viewed in FIG. 4, and the overhanging piece 22f forms a preloading chamber 27 which is an annular, substantially hermetically sealed space between it and a level difference 21b provided on the upper end of the lens moving member 21 as viewed in FIG. 4. An aperture 27a is formed between the inner peripheral surface of the overhanging piece 22f of the tubular fixed guide 22a and the outer peripheral surface of the lens moving member 21, and pressurized air is supplied from an internal pipe 27b which is pressurized air supply means for the tubular fixed guide 22a to the preloading chamber 27, and the level difference 21b of the lens moving member 21 is urged downwardly as viewed in FIG. 4 by the increasing air pressure, whereby the lens moving member 21 is biased toward the lens fixing member 22 with the lens driving member 24.

Static pressure bearing pads 26a and 26b which are annular first and second static pressure bearing means are provided on the upper surface of the lens fixing member 22 as viewed in FIG. 4 and the lower surface of the lens moving member 21 as viewed in FIG. 4, respectively, and the static pressure bearing pads 26a and 26b noncontact-support the lens driving member 24 for reciprocal movement therebetween. The upper surface of the lens driving member 24 is inclined in the X direction, and the lower surface of the lens moving member 21 is also inclined along it at the same angle of inclination. Accordingly, when the lens driving member 24 is moved in the X direction by the actuator 25, the lens moving member 21 is moved in a direction perpendicular to the X direction and the Y direction (hereinafter referred to as the "Z direction") while keeping its parallelism to the lens fixing member 22. The relation that $\delta Z = \delta X. \tan(\theta)$ is established among the amount of movement $\delta X$ of the lens driving member 24 in the X direction, the angle of inclination $\theta$ of the inclined surface of each of the lens driving member 24 and the lens moving member 21, and the amount of movement $\delta Z$ of the lens moving member 21 in the Z direction.

The tubular fixed guide 22a has on the inner peripheral surface thereof a static pressure bearing pad 26c which is a tubular-shaped third static pressure bearing surface opposed to the outer peripheral surface of the lens moving member 21, whereby it noncontact-supports the lens moving member 21 for reciprocal movement in the axial direction, and guide blocks 22b–22e have static pressure bearing pads 26d, 26e, 26f, 26g on the surface opposed to the connecting member 24a of the lens driving member 24 and the surface opposed to the guide member 24b of the lens driving member 24 and to the anti-rotation guide 21a of the lens moving member 21, respectively. The connecting member 24a, the guide member 24b and the anti-rotation guide 21a are noncontact-supported by these pads.

The constructions of the static pressure bearing pads 26d, 26e, 26f, 26g are substantially the same as the construction of the static pressure bearing pads in the first embodiment and therefore the explanation is omitted herein.

In the present embodiment, the position of the lens can be controlled highly accurately in the direction of the optical axis and moreover, the lens is supported stably, and when it is moved, there is no possibility of rolling and pitching. Further, oil supply is not required and therefore the degree of cleanness is high.

The parallel-moving apparatus of the present invention can control the amount of movement of the movable table highly accurately. As a result, the positioning accuracy of the movable table can be greatly improved. In addition, the working cost is low, and maintenance is simple and the degree of cleanness is high.

Also, the lens moving device in the exposing apparatus using the parallel-moving apparatus of the present invention can control the position of the lens highly accurately and moreover, is low in the working cost thereof and further, supports the lens stably and does not create any localized stress. Accordingly, the parallel-moving apparatus can move the lens without varying the refractive index of the lens with the deformation of the lens. In addition, it is high in the degree cleanness and therefore has no possibility of contaminating the lens.

What is claimed is:

1. A parallel-moving apparatus comprising:
   a fixed table;
   a first static pressure bearing;
   a driving plate having a first surface and a second surface inclined with respect to said first surface, wherein said driving plate is noncontact-supported on said fixed table on said first surface side by way of said first static pressure bearing;
   a driving means for moving said driving plate along said fixed table;
   a second static pressure bearing;
   a movable table noncontact-supported on said driving plate on said second surface side by way of said second static pressure bearing;
   support means for supporting said movable table for movement toward and away from said fixed table; and
   biasing means for biasing said movable table toward said fixed table with said driving plate;
   that surface of said fixed table which is opposed to said driving plate being substantially parallel to the first surface of said driving plate, that surface of said movable table which is opposed to said driving plate being substantially parallel to the second surface of said driving plate.

2. The apparatus according to claim 1, wherein said support means includes a third static pressure bearing for noncontact-supporting the outer peripheral edge of said movable table.

3. The apparatus according to claim 1, wherein said biasing means has a substantially hermetically sealed space provided between said fixed table and said movable table, and pressurized gas supply means for supplying pressurized gas thereto.

4. An exposing apparatus comprising:
   a fixed table;
   a first static pressure bearing;
   a driving plate having a first surface and a second surface inclined with respect to said first surface, said driving plate being noncontact-supported on said fixed table on said first surface side through said first static pressure bearing;
   a driving means for moving said driving plate along said fixed table;
   a second static pressure bearing;
   a movable table noncontact-supported on said driving plate on said second surface side through said second static pressure bearing, wherein said movable table holds a lens.
   support means for movably supporting said movable table in the direction of the optical axis of said lens; and
   biasing means for biasing said movable table toward said fixed table with said driving plate;
   that surface of said fixed table which is opposed to said driving plate being substantially parallel to the first surface of said driving plate, that surface of said movable table which is opposed to said driving plate being substantially parallel to the second surface of said driving plate.

5. The apparatus according to claim 4, wherein said support means has a third static pressure bearing for noncontact-supporting the outer peripheral edge of said movable table.

6. The apparatus according to claim 4, wherein said biasing means has a substantially hermetically sealed space provided between said fixed table and said movable table, and pressurized gas supply means for supplying pressurized gas thereto.

7. The apparatus according to claim 4, wherein said lens is utilized to project an original place pattern onto a semiconductive substrate.

* * * * *

UNITED STATES PATENT AND TRADEMARK OFFICE
CERTIFICATE OF CORRECTION

PATENT NO. : 5,376,988
DATED : December 27, 1994
INVENTOR(S) : Osanai

It is certified that error appears in the above-indentified patent and that said Letters Patent is hereby corrected as shown below:

COLUMN 8:

Line 28, "lens." should read --lens;--.

Signed and Sealed this

Twenty-third Day of May, 1995

Attest:

BRUCE LEHMAN

Attesting Officer

Commissioner of Patents and Trademarks